(12) United States Patent
Hwang et al.

(10) Patent No.: US 9,084,344 B2
(45) Date of Patent: Jul. 14, 2015

(54) DISPLAY APPARATUS

(75) Inventors: Kwang Sung Hwang, Suwon-si (KR);
Jin Young Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 832 days.

(21) Appl. No.: 13/336,430

(22) Filed: Dec. 23, 2011

(65) Prior Publication Data

US 2012/0163645 A1    Jun. 28, 2012

(30) Foreign Application Priority Data

Dec. 24, 2010    (KR) ........................ 10-2010-0134780

(51) Int. Cl.
*H04N 5/225* (2006.01)
*H05K 7/14* (2006.01)
*H05K 5/02* (2006.01)

(52) U.S. Cl.
CPC ........................................ *H05K 5/02* (2013.01)

(58) Field of Classification Search
CPC ..................................... H04R 1/02; H05K 7/16
See application file for complete search history.

(56) References Cited

U.S. PATENT DOCUMENTS

| | | | | |
|---|---|---|---|---|
| 7,737,956 B2 * | 6/2010 | Hsieh et al. | .................... | 345/173 |
| 8,368,805 B2 * | 2/2013 | Kim | ................ | 348/373 |
| 8,542,497 B2 * | 9/2013 | Sakata et al. | ................ | 361/796 |
| 8,683,382 B2 * | 3/2014 | Yun et al. | ....................... | 715/810 |
| 8,786,557 B2 * | 7/2014 | Noguchi et al. | ............... | 345/173 |
| 2002/0050977 A1 * | 5/2002 | Hsieh et al. | .................... | 345/156 |
| 2003/0169573 A1 * | 9/2003 | Irie et al. | ........................ | 361/752 |
| 2006/0152909 A1 * | 7/2006 | Nomoto et al. | ............... | 361/730 |
| 2006/0245171 A1 * | 11/2006 | Kim et al. | ..................... | 361/752 |
| 2007/0076384 A1 * | 4/2007 | Shin | ............................. | 361/752 |
| 2007/0223187 A1 * | 9/2007 | Chou et al. | .................... | 361/683 |
| 2007/0254695 A1 * | 11/2007 | Langberg et al. | .......... | 455/556.1 |
| 2010/0073583 A1 * | 3/2010 | Park et al. | ..................... | 348/794 |
| 2010/0079106 A1 * | 4/2010 | Graham | ....................... | 320/115 |
| 2010/0245280 A1 * | 9/2010 | Choi | .............................. | 345/173 |

FOREIGN PATENT DOCUMENTS

| | | |
|---|---|---|
| KR | 10-2006-0038711 A | 5/2006 |
| KR | 10-2008-0063681 A | 7/2008 |
| KR | 10-2008-0105219 A | 12/2008 |

* cited by examiner

*Primary Examiner* — Hoa C Nguyen
*Assistant Examiner* — Xanthia C Cunningham
(74) *Attorney, Agent, or Firm* — Sughrue Mion, PLLC (57) ABSTRACT

A display apparatus is provided which includes a display panel, a front cover which accommodates a front of the display panel, the front cover being provided with a front cover extension formed at one side, a rear cover coupled to the front cover, the rear cover being provided with a rear cover extension corresponding to the front cover extension of the front cover, a bracket panel mounted between the display panel and the rear cover to support the display panel, the bracket panel including a coupling part coupled to the rear of the display panel and a support part which extends from a lower part of the coupling part, a stand unit coupled to the lower end of the support part of the bracket panel, the stand unit having a main circuit board mounted therein, and a hinge fixed to the support part of the bracket panel.

20 Claims, 9 Drawing Sheets

DISPLAY APPARATUS

CROSS-REFERENCE TO RELATED APPLICATION

This application claims priority from Korean Patent Application No. 10-2010-0134780, filed on Dec. 24, 2010 in the Korean Intellectual Property Office, the disclosure of which is incorporated herein by reference in its entirety.

BACKGROUND

1. Field

Exemplary embodiments of the present invention relate to a display apparatus having a slim monitor.

2. Description of the Related Art

A display apparatus displays an image on a screen. Representative examples of a display apparatus may include a television (TV) and a computer monitor.

Generally, a display apparatus includes a cover defining the external appearance thereof, a display panel mounted in the cover to display an image, and a circuit board on which electric components to drive and control the display panel are disposed.

In recent years, with the improvement in quality of display apparatuses, companies have begun to focus more on consumer demand in addition to basic functions thereof.

Such consumer demand relates to consumer satisfaction and aesthetics. To this end, a display apparatus is manufactured so that the display apparatus provides an aesthetically pleasing appearance and has a slim monitor.

SUMMARY

It is an aspect of at least one exemplary embodiment to provide a display apparatus having a monitor that is as slim as possible, thereby providing an aesthetically pleasing appearance.

It is another aspect of at least one exemplary embodiment to provide a display apparatus wherein a support member to support a monitor is mounted eccentrically in one direction, thereby providing an excellent appearance.

Additional aspects of exemplary embodiments will be set forth in part in the description which follows and, in part, will be obvious from the description, or may be learned by practice of the invention.

In accordance with one aspect of an exemplary embodiment, a display apparatus includes a display panel, a front cover to accommodate the front panel at the front of the display panel, the front cover being provided at the lower part thereof with a front cover extension formed eccentrically in one direction, a rear cover coupled to the front cover at the rear of the display panel to define the rear appearance thereof, the rear cover being provided at the lower part thereof with a rear cover extension corresponding to the front cover extension of the front cover, a bracket panel mounted between the display panel and the rear cover to support the display panel, the bracket panel including a coupling part coupled to the lower end of the rear of the display panel and a support part eccentrically formed at the lower part of the coupling part so as to correspond to the front cover extension of the front cover, a stand unit coupled to the lower end of the support part of the bracket panel, the stand unit having a main board mounted therein, and a hinge fixed to the support part of the bracket panel so that the hinge is rotatably coupled to the stand unit.

The display panel may be provided at the lower end of the rear thereof with fixing protrusions configured to be fixed to the coupling part of the bracket panel.

The fixing protrusions provided at the lower end of the rear of the display panel may include an upper fixing protrusion and a lower fixing protrusion vertically spaced apart from each other.

The front cover extension of the front cover, the rear cover extension of the rear cover and the support part of the bracket panel may be formed in the same streamline shape.

The front cover extension of the front cover may be provided at the front thereof with a function key.

The function key provided at the front of the front cover extension of the front cover may be formed to have a touch type structure.

The front cover extension of the front cover may be provided at the rear thereof with a function key board to control the function key.

The coupling part of the bracket panel may be provided with bracket panel holes for display panel coupling, and the bracket panel holes may include an upper bracket panel hole into which the upper fixing protrusion of the display panel is coupled and a lower bracket panel hole into which the lower fixing protrusion of the display panel is coupled.

The upper bracket panel hole and the lower bracket panel hole provided at the coupling part of the bracket panel may be formed upward from the left side to the right side of the coupling part.

The display panel may be coupled to the coupling part of the bracket panel in a state in which the left side of the display panel is located upward more than the right side of the display panel so that the upper fixing protrusion of the display panel is aligned with the upper bracket panel hole of the bracket panel and the lower fixing protrusion of the display panel is aligned with the lower bracket panel hole of the bracket panel.

The stand unit may include an upper end cover, a cover assembly part coupled to the lower part of the upper end cover, a bottom bracket to which the main board is assembled, and a lower end cover coupled to the lower part of the bottom bracket.

The display apparatus may further include an insulated member disposed between the main board and the bottom bracket.

The stand unit may have a sub board mounted therein, the main board and the sub board being connected to each other via a cable.

The stand unit may have a speaker and a Bluetooth module mounted therein.

The stand unit may be provided at the front thereof with a speaker output part.

The hinge may be coupled to the front of the support part of the bracket panel to reinforce the bracket panel supporting the display panel, and the lower end of the hinge coupled to the front of the support part of the bracket panel may be rotatably coupled to the bottom bracket of the stand unit.

In accordance with another aspect of an exemplary embodiment, a display apparatus includes a display panel, a front cover to accommodate the front panel at the front of the display panel, a rear cover coupled to the front cover at the rear of the display panel to define the rear appearance thereof, a bracket panel mounted between the display panel and the rear cover, the bracket panel being coupled to the display panel to support the display panel, a stand unit coupled to the bracket panel, the stand unit having a main board and a sub board mounted therein, and a hinge fixed to the bracket panel so that the lower part of the hinge is rotatably coupled to the stand unit, wherein the display panel is connected to the main board mounted in the stand unit to control the display panel via a flexible printed circuit (FPC) cable, the FPC cable extending via the bracket panel to support the display panel and the front of the hinge.

The front cover may be provided at the front thereof with a function key and the front cover may be provided at the rear thereof with a function key board to control the function key.

The function key board may be connected to the main board mounted in the stand unit via a function key cable, the function key cable extending via the bracket panel to support the display panel and the front of the hinge.

The main board and the sub board mounted in the stand unit may be connected to each other via a cable.

The stand unit may have a speaker and a Bluetooth module mounted therein, the speaker and the Bluetooth module being connected to the main board via cables.

BRIEF DESCRIPTION OF THE DRAWINGS

These and/or other aspects of the invention will become apparent and more readily appreciated from the following description of the exemplary embodiments, taken in conjunction with the accompanying drawings of which.

DETAILED DESCRIPTION

Reference will now be made in detail to the exemplary embodiments, examples of which are illustrated in the accompanying drawings, wherein like reference numerals refer to like elements throughout. The following description is provided to assist in a comprehensive understanding of exemplary embodiments. However, the exemplary embodiments can be practiced without specifically defined matters provided in the description and the description should not be read as limiting to those specifically defined matters. Also, well-known functions or constructions are not described in detail since they would obscure the application with unnecessary detail.

Figure 2:
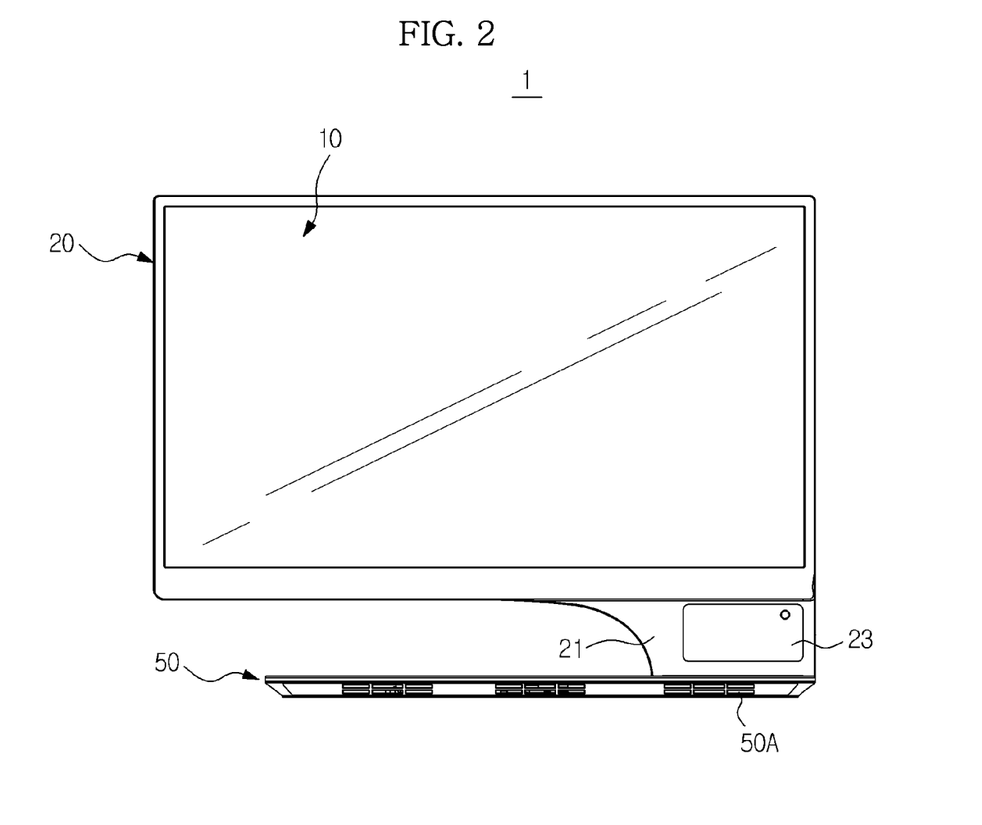
FIG. 2 is a front view of the display apparatus according to the exemplary embodiment.
Figure 3:
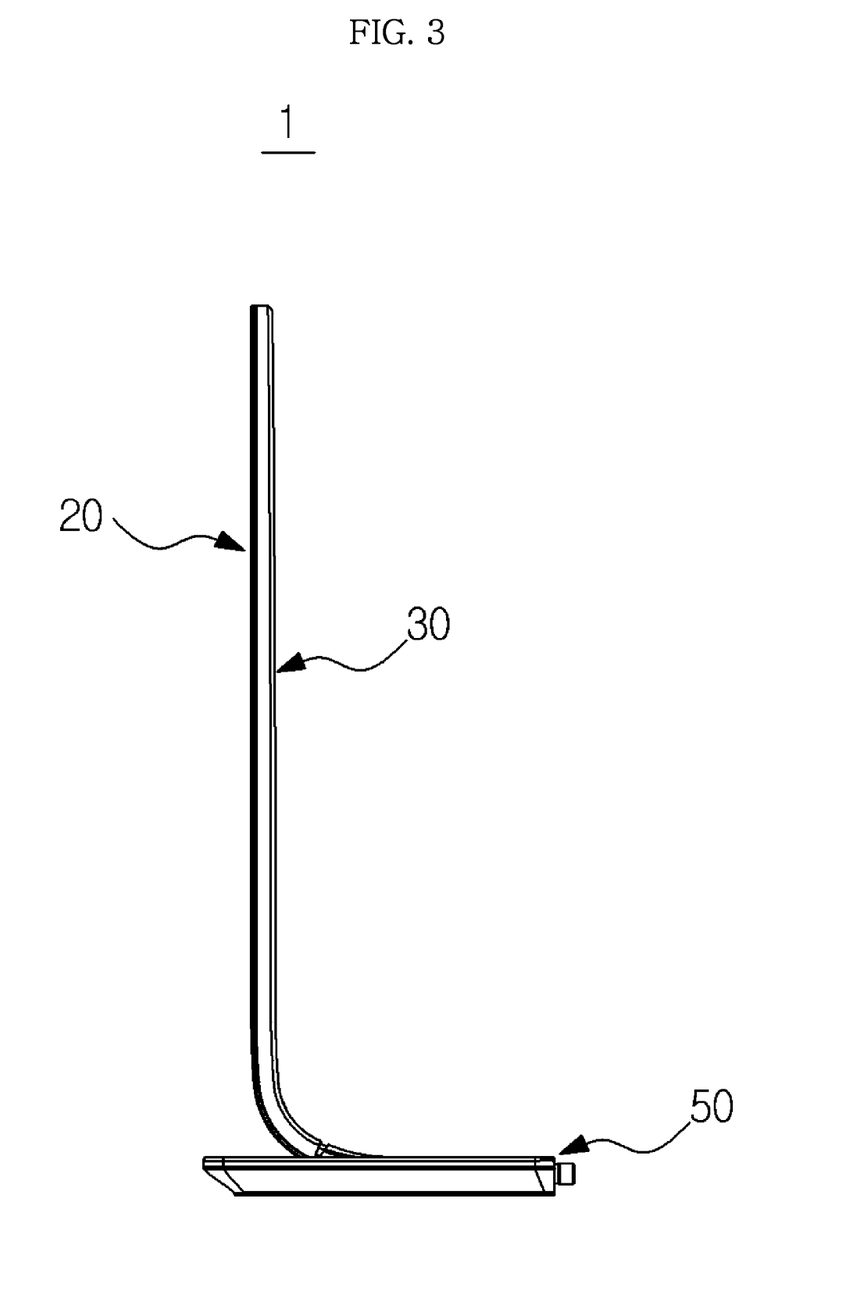
FIG. 3 is a schematic side sectional view of the display apparatus according to the exemplary embodiment.

In FIG. 2, which is a front view of a display apparatus 1, the side at which a front cover extension 21 is formed of the display apparatus 1 is referred to as the right side and the other side which does not have the front cover extension 21 formed is referred to as the left side.

FIGS. 1 to 4 are a perspective view, a front view, a schematic side sectional view and an exploded perspective view of a display apparatus 1 according to an exemplary embodiment.

As shown in FIGS. 1 to 4, the display apparatus 1 includes a display panel 10 to display an image, a front cover 20 to accommodate a front portion of the display panel 10, a rear cover 30 coupled to the front cover 20 at a rear portion of the display panel 10 to define the rear appearance thereof, a bracket panel 40 mounted between the display panel 10 and the rear cover 30 to support the display panel 10, a stand unit 50 coupled to the bracket panel 40 to define a base, the stand unit 50 having a main board MC mounted therein, and a hinge 60 fixed to the bracket panel 40 so that the hinge 60 is rotatably coupled to the stand unit 50.

Figure 5:
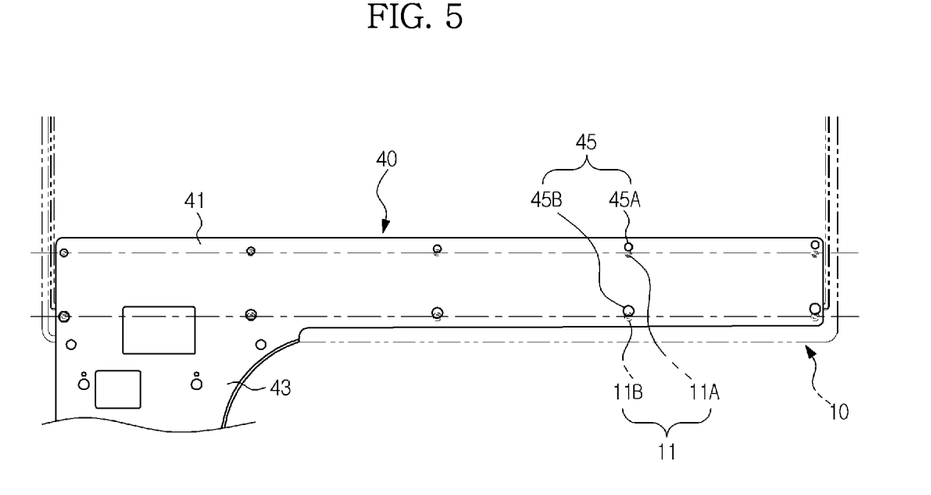
FIG. 5 is a side sectional view illustrating the coupling between a display panel and a bracket panel according to an exemplary embodiment.
Figure 8:
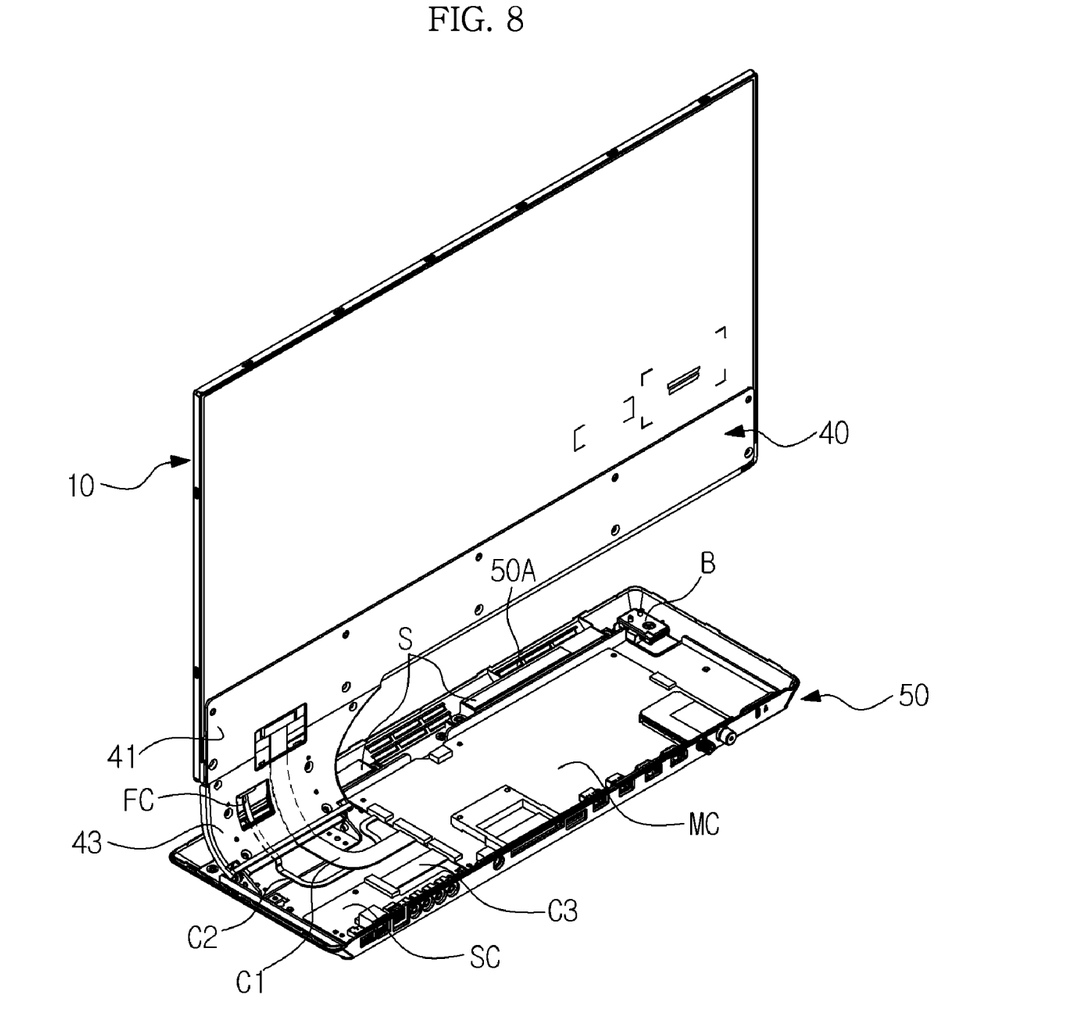
FIG. 8 is a rear perspective view of the display apparatus according to the exemplary embodiment.

As shown in FIG. 8, the display panel 10 is connected to the main board MC mounted in the stand unit 50, which will be described below, via a flexible printed circuit (FPC) cable C1 to display an image under control of the main board MC As shown in FIG. 5, fixing protrusions 11 configured to be fixed to a coupling part 41 included in the bracket panel 40, which will be described below, are formed at the lower end of the rear of the display panel 10.

The fixing protrusions 11 formed at the lower end of the rear of the display panel 10 include an upper fixing protrusion 11A and a lower fixing protrusion 11B vertically spaced apart from each other.

The display panel 10 is coupled to the bracket panel 40 so that the upper fixing protrusion 11A and the lower fixing protrusion 11B are coupled into an upper bracket panel hole 45A and a lower bracket panel hole 45B of the bracket panel 40, which will be described below.

As shown in FIGS. 1 to 4, the front cover 20 accommodates the display panel 10 at the front of the display panel 10 so that the front cover 20 surrounds the edge of the display panel 10.

The front cover 20 is provided at the lower part thereof with a front cover extension 21 formed eccentrically in one direction.

The front cover extension 21 is formed eccentrically in one direction and in a streamline shape, thereby providing an excellent appearance.

The front cover extension 21 is formed to cover the front of a support part 43 of the bracket panel 40, which will be described below, so that the support part 43 of the bracket panel 40 is not exposed to the outside.

Figure 1:
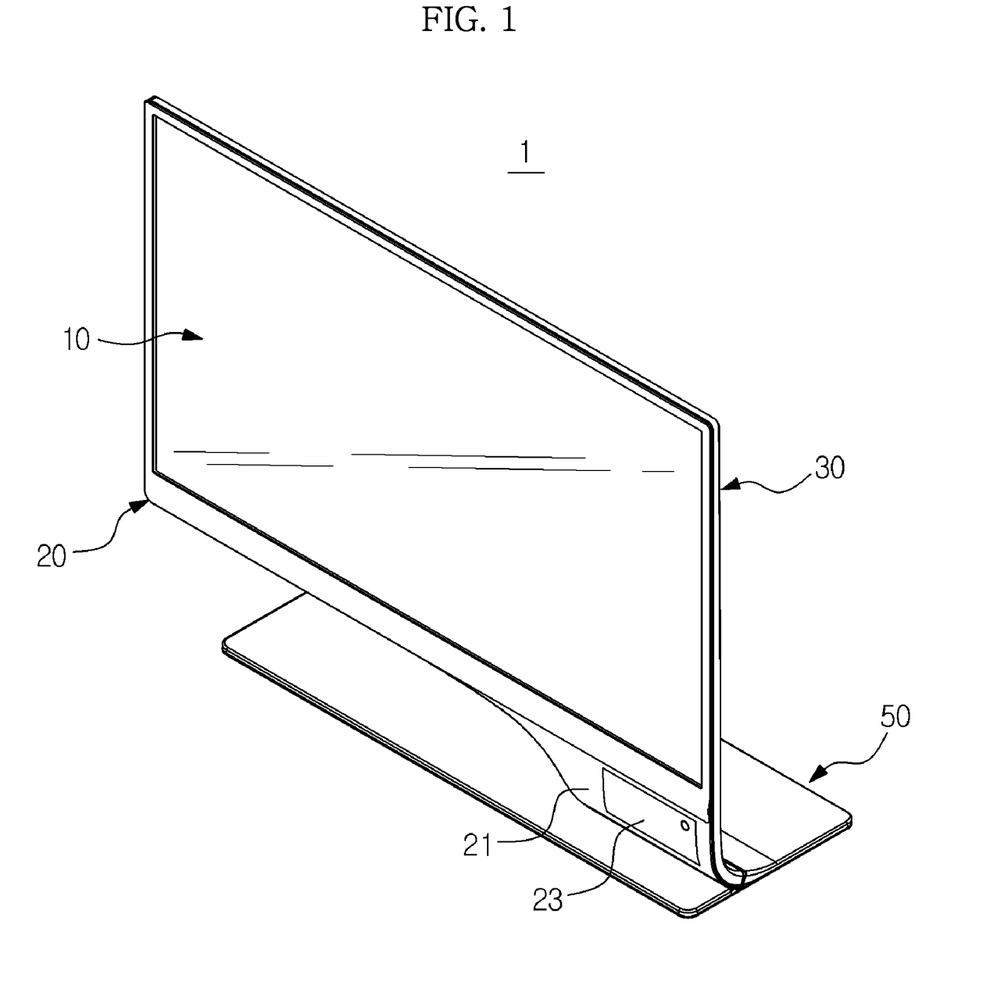
FIG. 1 is a perspective view illustrating a display apparatus according to an exemplary embodiment.

A function key 23 is formed at the front of the front cover extension 21. The function key 23 may be formed to have a touch type structure. The function key 23 may be a key pad which has a plurality of keys.

A function key board FC is mounted at the rear of the front cover extension 21 to control the function key 23 formed at the front of the front cover extension 21.

As shown in FIG. 8, the function key board FC is connected to the main board MC mounted in the stand unit 50, which will be described below, via a function key cable C2.

As shown in FIGS. 1 to 4, the rear cover 30 is coupled to the front cover 20 at the rear of the display panel 10 to define the rear appearance thereof.

The rear cover 30 is provided at the lower part thereof with a rear cover extension 31 in the same manner as the front cover 20. The rear cover extension 31 is formed eccentrically in one direction so as to correspond to and align with the front cover extension 21.

Also, the rear cover extension 31 is formed in a streamline shape in the same manner as the front cover extension 21, thereby providing an excellent appearance.

The rear cover extension 31 is formed to cover the rear of the support part 43 of the bracket panel 40, which will be described below, so that the support part 43 of the bracket panel 40 is not exposed to the outside.

As shown in FIGS. 4, 5, 7 and 8, the bracket panel 40 is mounted between the display panel 10 and the rear cover 30 and is coupled to the display panel 10 to support the display panel 10.

The bracket panel 40 to support the display panel 10 includes the coupling part 41 coupled to the lower end of the rear of the display panel 10 and the support part 43 formed at the lower part of the coupling part 41 eccentrically in one direction so as to correspond to the front cover extension 21 of the front cover 20.

Shown in FIG. 5, bracket panel holes 45 for display panel coupling are formed at the coupling part 41 of the bracket panel 40 coupled to the lower end of the rear of the display panel 10.

The bracket panel holes 45 include an upper bracket panel hole 45A, into which the upper fixing protrusion 11A of the display panel 10 is coupled, and a lower bracket panel hole 45B, into which the lower fixing protrusion 11B of the display panel 10 is coupled.

The bracket panel 40 is coupled to the display panel 10 in a state in which the upper fixing protrusion 11A of the display panel 10 is aligned with the upper bracket panel hole 45A of the bracket panel 40 and the lower fixing protrusion 11B of the display panel 10 is aligned with the lower bracket panel hole 45B of the bracket panel 40.

The display panel 10 is supported by the bracket panel 40 eccentrically in one direction. When the display panel 10 is coupled to the bracket panel 40, therefore, the side of the display panel 10 which is not supported by the bracket panel 40 may droop downward.

To prevent the display panel 10 from drooping, the upper bracket panel hole 45A and the lower bracket panel hole 45B formed at the coupling part 41 of the bracket panel 40 are formed upward from the left side to the right side of the coupling part 41.

Since the upper bracket panel hole 45A and the lower bracket panel hole 45B formed at the coupling part 41 of the bracket panel 40 are formed upward from the left side to the right side of the coupling part 41, the left side of the display panel 10 which is not supported by the bracket panel 40 is located upward more than the right side of the display panel 10 which is supported by the bracket panel 40 when the display panel is coupled to the bracket panel 40.

The display panel 10 is coupled to the bracket panel 40 in a state in which the left side of the display panel 10 is located upward more than the right side of the display panel 10, and therefore, the display panel 10 is prevented from drooping. Consequently, the display panel 10 is horizontally disposed when the display panel 10 is coupled to the bracket panel 40.

Since the display panel 10 is coupled to the bracket panel 40 as described above, the left side of the display panel 10, which is not supported by the bracket panel 40, is prevented from drooping downward.

As shown in FIGS. 1 to 4, the stand unit 50 is coupled to the bracket panel 40 to form a base.

Figure 4:
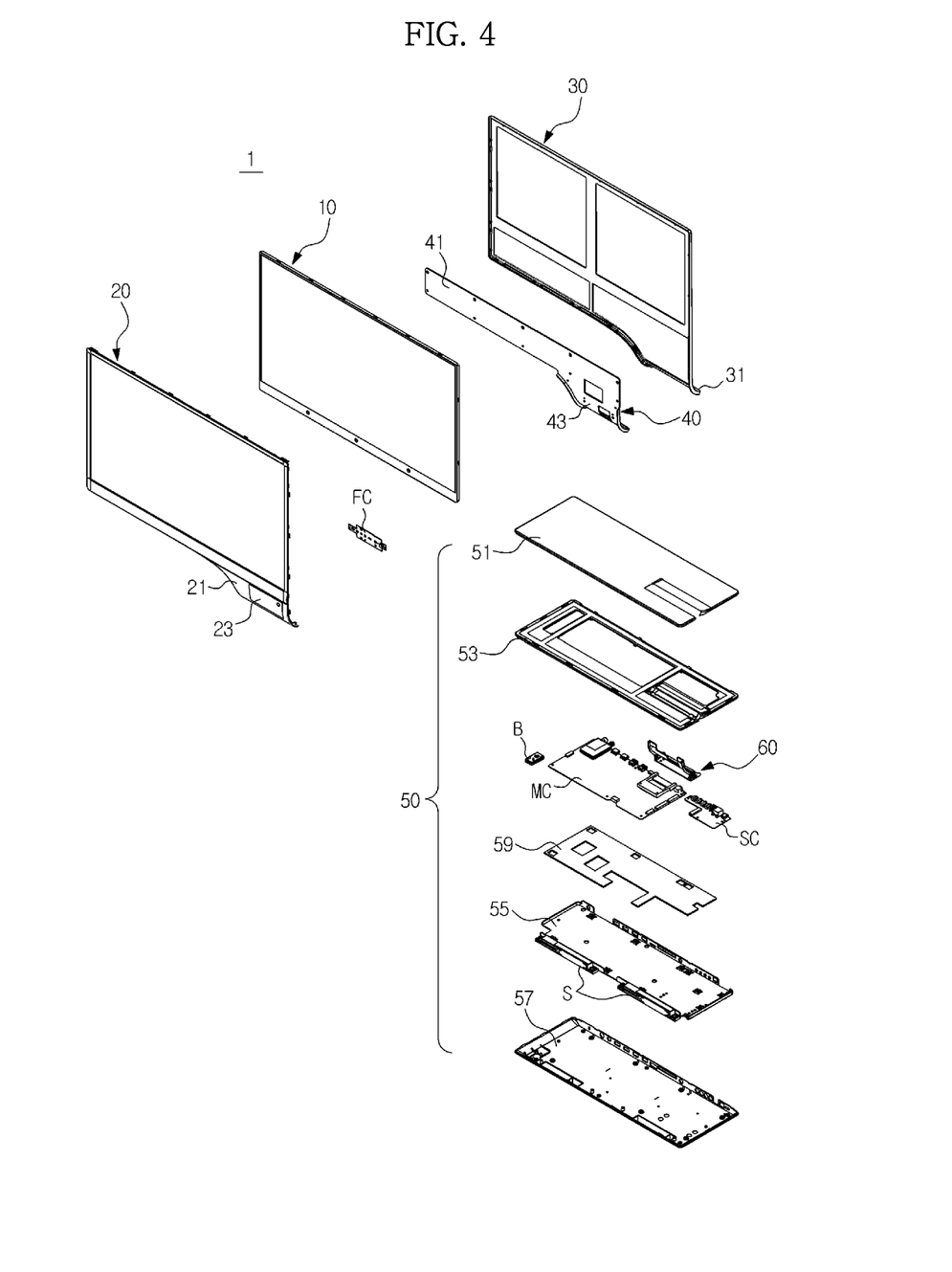
FIG. 4 is an exploded perspective view of the display apparatus according to the exemplary embodiment.

The stand unit 50 includes an upper end cover 51, a cover assembly part 53 coupled to the lower part of the upper end cover 51, a bottom bracket 55 to which the main board MC is assembled, and a lower end cover 57 coupled to the lower part of the bottom bracket 55.

When the main board MC is assembled to the bottom bracket 55 of the stand unit 50, an insulated member 59 may be disposed between the main board MC and the bottom bracket 55.

Figure 6:
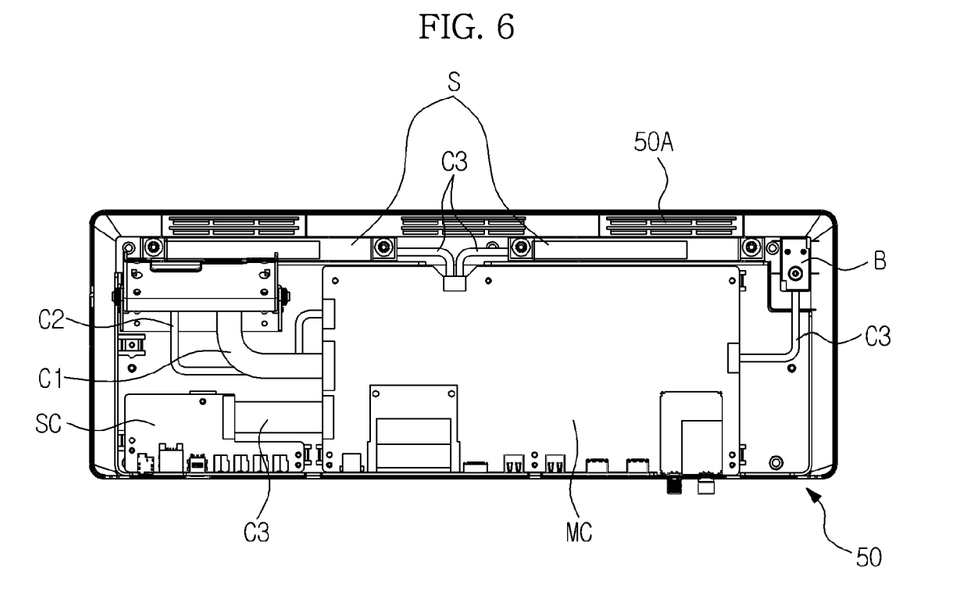
FIG. 6 is a view illustrating the interior of a stand unit of the display apparatus according to the exemplary embodiment.

As shown in FIGS. 6 and 8, a sub board SC may be further provided so as to reduce the size of the main board MC mounted in the stand unit 50. The main board MC and the sub board SC are mounted in the stand unit 50.

The main board MC and the sub board SC are connected to each other via a cable C3.

Also, a speaker S and a Bluetooth module B may be additionally mounted in the stand unit 50.

The speaker S and the Bluetooth module B mounted in the stand unit 50 are also connected to each other via the cable C3.

As shown in FIG. 2, a speaker output part 50A is formed at the front of the stand unit 50 in which the speaker S is mounted.

Figure 7:
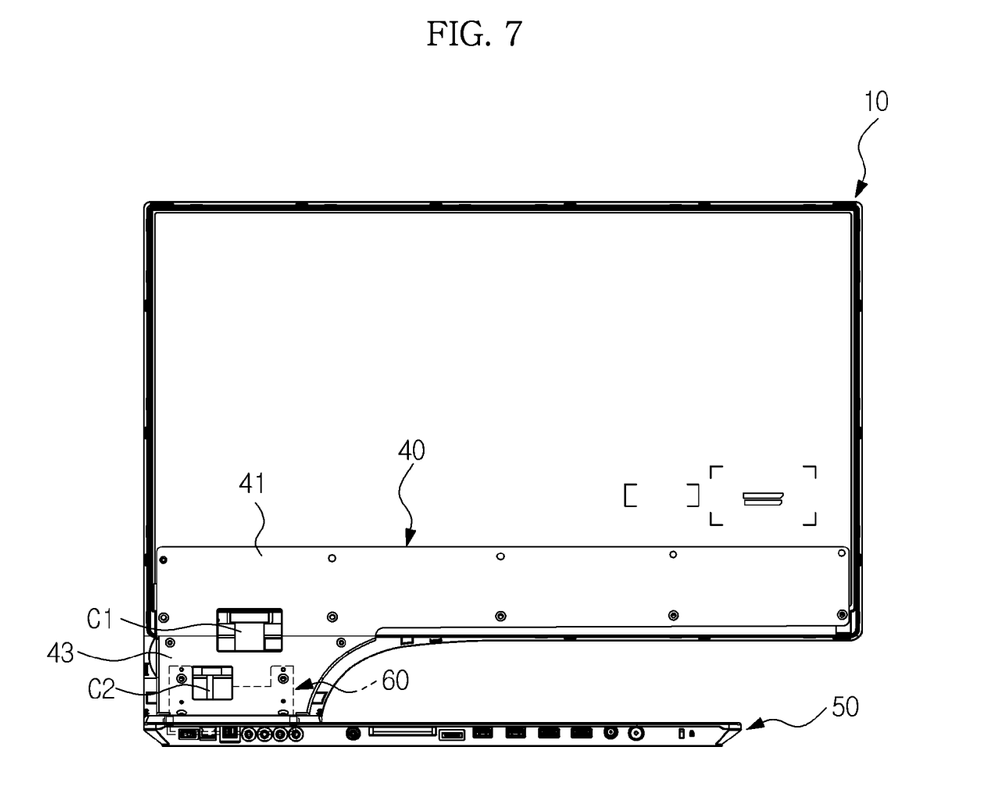
FIG. 7 is a view illustrating a state in which the display panel and the bracket panel according to the exemplary embodiment are coupled to each other and a hinge is fixed to the bracket panel.

Also, as shown in FIGS. 6 to 8, ports configured to be connected to various peripherals may be formed at the rear of the stand unit 50.

As shown in FIGS. 4 and 7, the hinge 60 is coupled to the front of the support part 43 of the bracket panel 40 so that the lower part of the hinge 60 is rotatably coupled to the stand unit 50.

The hinge 60 is fixed to the front of the support part 43 of the bracket panel 40 to reinforce the bracket panel 40 supporting the display panel 10.

Since the hinge 60 is coupled to the front of the support part 43 of the bracket panel 40, the bracket panel 40 supports the display panel with sufficient strength.

The hinge 60 is rotatably coupled to the bottom bracket 55 of the stand unit 50 so that the display panel 10 is rotated upward and downward (i.e., front to back).

Figure 9:
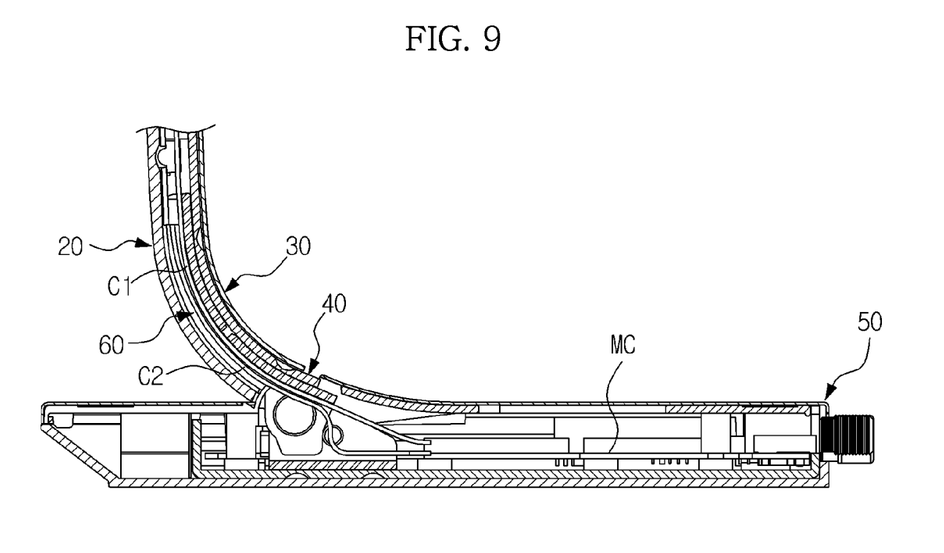
FIG. 9 is a view illustrating a state in which a flexible printed circuit (FPC) cable and a function key cable of the display apparatus according to the exemplary embodiment extend via a support part of the bracket panel and the front of the hinge.

As shown in FIGS. 7 to 9, the display panel 10 is connected to the main board MC mounted in the stand unit 50 via the FPC cable C1. The FPC cable C1 extends via the bracket panel 40 supporting the display panel 10 and the front of the hinge 60.

Also, the function key board FC mounted at the rear of the front cover 20 to control the function key 23 formed at the front of the front cover 20 is connected to the main board MC mounted in the stand unit 50 via the function key cable C2. The function key cable C2 extends via the bracket panel 40 supporting the display panel 10 and the front of the hinge 60.

As is apparent from the above description, the main board is mounted in the stand unit. Consequently, the monitor portion made up of the display panel 10, the front cover 20 and the rear cover 30 has a compact and slim structure.

Also, the support part of the bracket panel supporting the display panel is mounted eccentrically in one direction of the display panel, thereby providing an excellent appearance.

Although a few exemplary embodiments have been shown and described, it would be appreciated by those skilled in the art that changes may be made in these exemplary embodiments without departing from the principles and spirit of the general inventive concept, the scope of which is defined in the claims and their equivalents.

What is claimed is:

1. A display apparatus comprising:
a display panel;
a front cover which accommodates a front of the display panel, the front cover being provided with a front cover extension formed at one side of a lower part of the front cover;
a rear cover coupled to the front cover at a rear of the display panel, the rear cover being provided with a rear cover extension at a lower part of the rear cover, wherein the rear cover extension corresponds with the front cover extension of the front cover;
a bracket panel mounted between the display panel and the rear cover to support the display panel, the bracket panel comprising a coupling part coupled to a lower end of the rear of the display panel and a support part formed at a lower part of the coupling part so as to correspond to the front cover extension of the front cover;

a stand unit coupled to a lower end of the support part of the bracket panel, the stand unit having a main circuit board mounted therein; and a hinge fixed to the support part of the bracket panel so that the hinge is rotatably coupled to the stand unit, wherein the stand unit comprises an upper end cover, a cover assembly part coupled to a lower part of the upper end cover, a bottom bracket to which the main circuit board is assembled, and a lower end cover coupled to a lower part of the bottom bracket.

2. The display apparatus according to claim 1, wherein the display panel is provided with fixing protrusions configured to be fixed to the coupling part of the bracket panel, wherein the fixing protrusions are located at the lower end of the rear of the display panel.

3. The display apparatus according to claim 2, wherein the fixing protrusions provided at the lower end of the rear of the display panel comprise an upper fixing protrusion and a lower fixing protrusion vertically spaced apart from each other.

4. The display apparatus according to claim 3, wherein the coupling part of the bracket panel is provided with bracket panel holes for coupling the display panel to the bracket panel, and the bracket panel holes comprise an upper bracket panel hole into which the upper fixing protrusion of the display panel is coupled and a lower bracket panel hole into which the lower fixing protrusion of the display panel is coupled.

5. The display apparatus according to claim 4, wherein the upper bracket panel hole and the lower bracket panel hole provided at the coupling part of the bracket panel are formed upward from a left side to a right side of the coupling part.

6. The display apparatus according to claim 5, wherein the display panel is coupled to the coupling part of the bracket panel in a state in which a left side of the display panel is located upward more than a right side of the display panel so that the upper fixing protrusion of the display panel is aligned with the upper bracket panel hole of the bracket panel and the lower fixing protrusion of the display panel is aligned with the lower bracket panel hole of the bracket panel.

7. The display apparatus according to claim 1, wherein the front cover extension of the front cover, the rear cover extension of the rear cover and the support part of the bracket panel are formed in a same shape.

8. The display apparatus according to claim 7, wherein the front cover extension of a front of the front cover is provided with a function key.

9. The display apparatus according to claim 8, wherein the function key provided at the front of the front cover extension of the front cover and is formed to have a touch type structure.

10. The display apparatus according to claim 9, wherein a rear of the front cover extension of the front cover is provided with a function key circuit board to control the function key.

11. The display apparatus according to claim 1, further comprising an insulated member disposed between the main board and the bottom bracket.

12. The display apparatus according to claim 11, wherein the stand unit has a sub circuit board mounted therein, the main circuit board and the sub circuit board are connected to each other via a cable.

13. The display apparatus according to claim 12, wherein the stand unit has a speaker and a Bluetooth module mounted therein.

14. The display apparatus according to claim 13, wherein the stand unit is provided with a speaker output part at a front of the stand unit.

15. The display apparatus according to claim 1, wherein the hinge is coupled to a front of the support part of the bracket panel to reinforce the bracket panel supporting the display panel, and a lower end of the hinge which is coupled to the front of the support part of the bracket panel is rotatably coupled to the bottom bracket of the stand unit.

16. A display apparatus comprising:

a display panel;

a front cover which accommodates a front of the display panel;

a rear cover coupled to the front cover at a rear of the display panel;

a bracket panel mounted between the display panel and the rear cover, the bracket panel being coupled to the display panel to support the display panel;

a stand unit coupled to the bracket panel, the stand unit having a main circuit board and a sub circuit board mounted therein; and a hinge fixed to the bracket panel so that a lower part of the hinge is rotatably coupled to the stand unit, wherein the display panel is connected to the main circuit board which is mounted in the stand unit to control the display panel via a flexible printed circuit (FPC) cable, the FPC cable extending via the bracket panel to support the display panel and a front of the hinge, and wherein the stand unit comprises an upper end cover, a cover assembly part coupled to a lower part of the upper end cover, a bottom bracket to which the main circuit board is assembled, and a lower end cover coupled to a lower part of the bottom bracket.

17. The display apparatus according to claim 16, wherein a front of the front cover is provided with a function key and a rear of the front cover is provided with a function key circuit board to control the function key.

18. The display apparatus according to claim 17, wherein the function key circuit board is connected to the main circuit board mounted in the stand unit via a function key cable, the function key cable extending via the bracket panel to support the display panel and the front of the hinge.

19. The display apparatus according to claim 16, wherein the main circuit board and the sub circuit board mounted in the stand unit are connected to each other via a cable.

20. The display apparatus according to claim 19, wherein the stand unit has a speaker and a Bluetooth module mounted therein, the speaker and the Bluetooth module being connected to the main circuit board via cables.

* * * * *